FLAT PACK HAVING A BERYLLIA BASE AND AN ALUMINA RING

Filed June 14, 1968 2 Sheets-Sheet 1

INVENTOR.
PHILIP S. HESSINGER
CHRISTIAN E. NELSON by Greene and Durr
ATTORNEYS.

FLAT PACK HAVING A BERYLLIA BASE AND AN ALUMINA RING

Filed June 14, 1968 2 Sheets-Sheet 2

INVENTOR.
PHILIP S. HESSINGER
CHRISTIAN E. NELSON
by Green and Durr
ATTORNEYS 3,495,023

FLAT PACK HAVING A BERYLLIA BASE AND AN ALUMINA RING

Philip S. Hessinger, West Caldwell, and Christian E. Nelson, Highland Lakes, N.J., assignors to National Beryllia Corp., Haskell, N.J., a corporation of New Jersey Filed June 14, 1968, Ser. No. 737,180
Int. Cl. H05k 5/03
U.S. Cl. 174—52 3 Claims

ABSTRACT OF THE DISCLOSURE

The flat pack of the invention comprises a beryllia base plate to the interior portion of which is secured as by soldering, a circuit chip and on which base circuit elements are coated or printed. An alumina ring surrounds the circuit chip without extending to the borders of the base and the alumina ring is sealed to the base. A cover is soldered or brazed to the top surface of the alumina ring to hermetically seal and enclose the region around the circuit clip.

This invention relates to an integrated circuit flat pack of the type which is mounted on a ceramic substrate and in which the essential parts of the circuit are retained in a hermetically sealed enclosure.

It is common to use electrically insulating ceramic base plates to support an integrated circuit chip and to provide a hermetically sealed enclosure over and about the base, which includes a ring or border of ceramic insulating material and a cover which may be of ceramic or of metal. In such devices, it is necessary to protect the circuit device from the outside environment in order to prevent contamination and possible passivation of the surfaces of the active device, and this is the reason for the hermetically sealed enclosure. The circuit device or chip is mounted to the base in such devices by soldering the same to a metalized portion of the base by means of a low melting eutectic alloy of gold and germanium or gold and silicon, for example. Also, the enclosing cover is mounted to the top of the enclosure wall or ring by a similar soldering process but with the aid of pressure to obtain a hermetic seal. During both soldering steps, the circuit elements must be protected from the heat required for the soldering in so far as possible.

The present invention is based on the discovery that the soldering and sealing operations are facilitated by a careful selection of materials for the ceramic base plate and the ceramic enclosing ring.

Among the objects of the invention, therefore, is to provide an improved integrated circuit flat pack with the essential parts thereof enclosed and hermetically sealed.

The objects of the invention are attained by providing a ceramic base plate, consisting essentially of beryllium oxide with a central metalized area of a size and shape to be connected by solder to a circuit chip and with metalized circuit leads emanating from points adjacent the central metalized area to points adjacent the border of the base plate, providing a ring of alumina ceramic, with a metalized top surface, adapted to surround an area larger than that covered by the circuit chip, but smaller than the area of said base plate, soldering a circuit chip to the central metalized area, sealing the alumina ring to the base plate by means of a glass, so that the ring surrounds the circuit chip, and sealing a cover plate of metal or ceramic to the metalized top surface of the ring by means of braze or solder applied to the contacting surfaces under heat with or without pressure.

The ceramic base plate can be rectangular, polygonal circular, elliptical or even irregular in shape. A very convenient shape is hexagonal.

To solder the cricuit chip to the metalized area of the beryllia base plate, heat is applied to the area from below by means of a die attach column, which is a well-known apparatus comprising means to heat a particular area of the base plate from below and cover means such that an inert atmosphere can be provided for the unit being heated and soldered. Since beryllia has good thermal conductivity, a fast solder cycle is employed.

To solder the cover to the metalized top surface of the alumina ring, the strength and low thermal conductivity of the alumina ring prevents the heat applied from the top or cover from reaching the lower edge of the ring, which is in contact with the glass seal layer on the circuit element. The joint between the alumina and beryllia parts is of high mechanical strength because the heat expansion coefficients of alumina and beryllia are closely matched.

The term ring is used in its broader sense in that it can be circular, elliptical, polygonal, etc.

Other and more detailed objects of the present invention will become apparent from the following specification and appended claims when taken in connection with the accompanying drawings, in which:

The flat pack, as illustrated, comprises the beryllia base 10, the alumina ring 30 and a cover plate 40.

Figure 1:
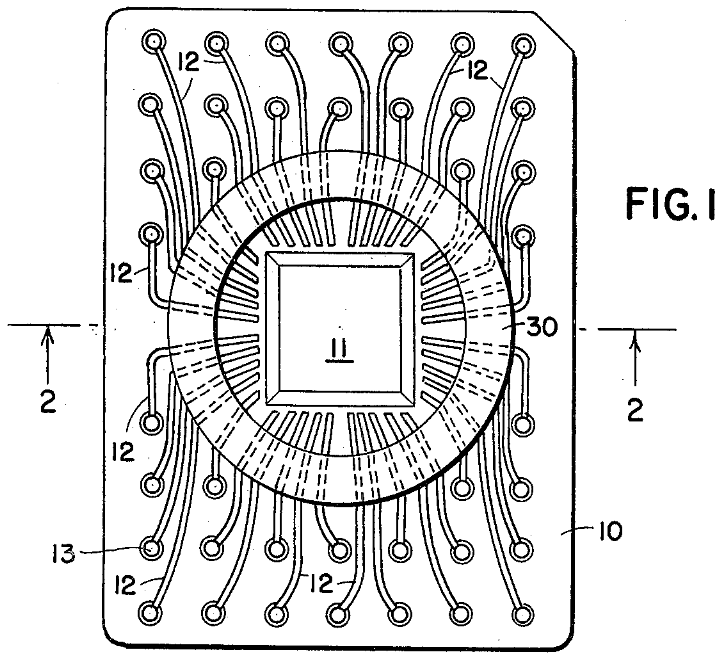
FIG. 1 is a top plan view of the flat pack of the invention with the cover removed and without the circuit chip.
Figure 2:
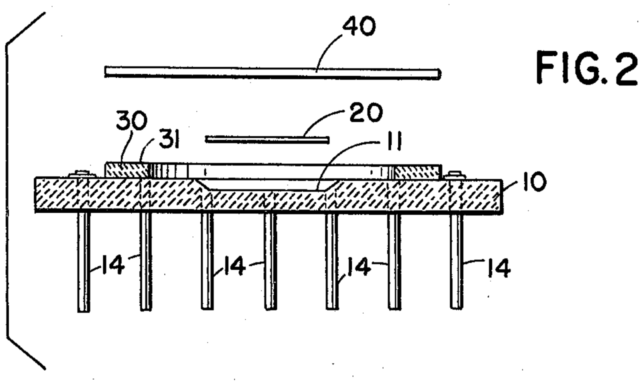
FIG. 2 is an exploded side view of the flat pack partly in cross-section.

The beryllia base plate 10 comprises a central metalized area 11 that may be depressed (as illustrated in FIG. 2) and emanating from the area adjacent the metalized area 11 are a plurality of printed circuit lines 12. Each circuit line 12 ends in an enlarged portion 13 through which passes a pin 14 which is advantageously made of "Kovar," or similar alloy.

Surrounding the central area 11 is the alumina ring 30 which is sealed to the base 10 by means of glass. Special glasses have been developed for this operation and are available on the market. The ring 30 can be sealed to the plate 10 before soldering the chip 20 thereto. The glass can be applied as a finely divided powder or as a preformed ring and the assembly is then heated to the sintering temperature of the glass and sealed together.

As illustrated in FIG. 2, a circuit chip 20 is soldered to the metalized surface 11. To solder the chip 20 to the surface 11, a drop of solder is applied to the surface 11, heat is applied from below the base plate 10 to the area opposite the surface 11 and the chip 20 is firmly pressed in place over the surface 11.

The top surface 31 of the alumina ring has been previously metalized by conventional means. The cover 40, which may be of "Kovar" or of a metalized ceramic material similar to ring 30, is then soldered to the ring 30. For this soldering, a gold based solder is applied to the metalized top of the ring and the cover is pressed onto the ring under a pressure of 10–20 p.s.i. and temperatures of 280°–300° C., for example, while heat is applied by means of a properly shaped, electrically heated, copper tool, for a period of 1–5 sec. The entire soldering operation can be carried out in an inert atmosphere of nitrogen or helium, for example, or under a vacuum.

Figure 3:
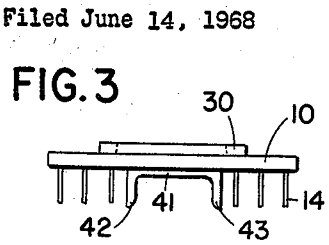
FIGS. 3 and 3A are end and bottom views, respectively, of a base similar to that of FIG. 1 fitted with a metal heat-sink and mounting member.
Figure 3A:
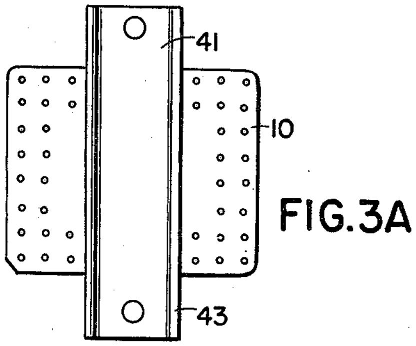

As shown in FIGS. 3 and 3A, a metallic heat sink member 41 may be brazed to the base 10 at some time during the manufacture thereof, preferably before the active chip and cover 40 are secured thereto. The heat sink member 41 is preferably a metal of high heat conductivity such as copper, copper alloys, aluminum, aluminum alloys, etc., but substantially any metal has good enough thermal conductivity to be useful for this purpose. The member 41 is shown as a channel shaped member with a flat face of the channel providing a substantial area of surface to surface contact and the sides 42 and 43 of the channel providing heat radiating surfaces. However, a plane strip member, a flat stud 45 (see FIG. 5A) or a strip with transverse fins (instead of the side fins 42 and 43), may be employed.

Figure 4:
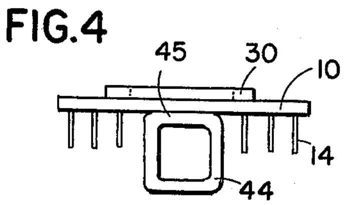
FIGS. 4 and 4A are the end and bottom views, respectively, similar to FIGS. 3 and 3A, but showing a cooling fluid conduit secured to the device of FIG. 1.
Figure 4A:
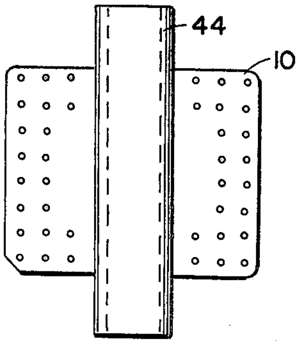
Figure 6:
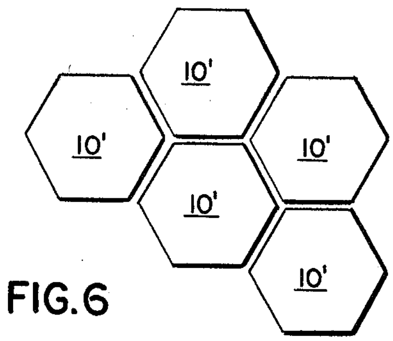
FIG. 6 illustrates how a number of units such as shown in FIG. 5 can be fitted together.

As shown in FIGS. 4 and 4A, positive cooling may be applied by brazing or soldering a flat surface 45 of a tubular member 44 to the bottom of plate 10. Said tubular member 44 can be made of metal or of some other fairly good thermal conducting material such as beryllia.

Figure 5:
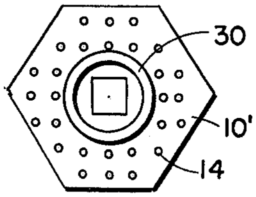
FIGS. 5 and 5A are plan and side views respectively, of a modified form of device showing a mounting stud which acts as a heat sink.
Figure 5A:
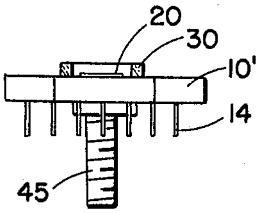

As illustrated in FIGS. 5 and 5A the beryllia base plate 10′ can be hexagonal in shape and a plurality of the finished packages may be mounted compactly. FIG. 5A also discloses the stud type of metal, heat-sink attachment 45.

The features and principles underlying the invention described above in connection with specific exemplifications will suggest to those skilled in the art many other modifications thereof.

We claim:

1. As an article of manufacture, an integrated circuit flat pack comprising a base plate consisting essentially of beryllia, a ring consisting essentially of alumina and defining an area adapted to fit within the boundary of said base plate and a cover plate, said base plate having a metalized area in the central portion thereof and a plurality of circuit lines emanating from points adjacent the edges of the central metalized area, an integrated circuit chip soldered to said central metalized area, said alumina ring being hermetically sealed to the base plate so as to suround said integrated circuit chip, and having an upper metalized surface, said cover being hermetically solder-sealed to the upper metalized surface of said ring.

2. A process for making an integrated circuit flat pack with an integrated circuit chip hermetically sealed within an enclosure comprising providing a ceramic base plate consisting essentially of beryllia and containing, on the upper surface thereof, a central metalized area and electrical circuit elements surrounding the metalized area, providing an alumina ring defining an area larger than the central metalized area of the base plate but smaller than the boundaries of said base plate and having a planar, upper metalized surface, glass bonding the lower surface of the alumina ring to the base plate so as to surround the central metalized area thereof, soldering a circuit chip to the central metalized area of the base plate by applying solder and heating said metalized area from the lower surface of the plate, thereafter soldering a cover plate to the upper metalized surface of the ring by applying solder and heat and pressure thereto.

3. The circuit flat pack as claimed in claim 1 comprising a heat-radiating means united to and making surface to surface contact with the base plate along the surface of the latter which is opposite to said metalized area.

References Cited

UNITED STATES PATENTS

| | | |
|---|---|---|
| 3,072,832 | 1/1963 | Kilby. |
| 3,312,771 | 4/1967 | Hessinger et al. |

DARRELL L. CLAY, Primary Examiner

U.S. Cl. X.R.

29—588, 627; 317—100, 234